(12) United States Patent
Aubert (10) Patent No.: US 7,403,009 B2
(45) Date of Patent: Jul. 22, 2008

(54) MAGNETIC GRADIENT WINDING SYSTEM COMPRISING CIRCULAR SOLENOID COILS

(75) Inventor: Guy Aubert, Poitiers (FR)

(73) Assignee: Commissariat A l'Energie Atomique, Paris (FR)

( * ) Notice: Subject to any disclaimer, the term of this patent is extended or adjusted under 35 U.S.C. 154(b) by 52 days.

(21) Appl. No.: 10/571,962

(22) PCT Filed: Sep. 2, 2004

(86) PCT No.: PCT/FR2004/050411

§ 371 (c)(1),
(2), (4) Date: Mar. 15, 2006

(87) PCT Pub. No.: WO2005/029110

PCT Pub. Date: Mar. 31, 2005

(65) Prior Publication Data

US 2007/0052418 A1   Mar. 8, 2007

(30) Foreign Application Priority Data

Sep. 15, 2003   (FR) .................................. 03 50541

(51) Int. Cl.
*G01V 3/00*   (2006.01)
(52) U.S. Cl. ...................................... 324/318; 324/319
(58) Field of Classification Search ................. 324/318, 324/319, 322
See application file for complete search history.

(56) References Cited

U.S. PATENT DOCUMENTS

| 4,985,679 A | 1/1991 | McDougall |
| 5,530,355 A | 6/1996 | Doty |
| 6,515,479 B1 * | 2/2003 | Arz et al. .................... 324/318 |

FOREIGN PATENT DOCUMENTS

| EP | 0221 810 A1 | 5/1987 |
| WO | WO 89/03031 | 4/1989 |

OTHER PUBLICATIONS

Quiet Magnetic Resonance Imaging Gradients; An Da Yeo; Department of Electrical Engineering/University of Queensland, Australia; Oct. 2000.

* cited by examiner

*Primary Examiner*—Louis M Arana
(74) *Attorney, Agent, or Firm*—Weingarten, Schurgin, Gagnebin & Lebovici LLP (57) ABSTRACT

In order to produce field strength gradients (x,y) for a NMR machine, the curve-shaped gradients are substituted by coils arraigned in tubes. Said tubes are distributed on the annular circumference (6) of the examination space of the tunnel NMR machine. Said invention makes it possible to produce at request field strength gradients in all necessary directions by providing each tube with the same set of coil elements and supplying them with selected currents.

23 Claims, 4 Drawing Sheets

MAGNETIC GRADIENT WINDING SYSTEM COMPRISING CIRCULAR SOLENOID COILS

This application is a §371 national phase filing of PCT/FR2004/050411 filed Sep. 2, 2004, and claims priority to a French application No. 03 50541 filed Sep. 15, 2003.

The subject of the present invention is a nuclear magnetic resonance (NMR) machine, especially, but not only, able to be used in the medical field. The object of the invention is to help in the creation of images, and therefore to allow differentiation of the excitations of the various parts of a volume under examination by the addition of temporary or permanent magnetic codings of the space. These codings are applied by gradient coils. The object of the invention is to improve the gradient coils by varying the operating conditions of NMR machines, especially by increasing the main field, concomitantly increasing the intensity of the gradients and reducing the acoustic noise that they produce.

Several types of machine are known in the nuclear magnetic resonance field. Machines with permanent magnets, often not offering a tunnel structure, are intended for orienting fields of around 0.15 tesla. Tunnel machines, of the resistive or superconducting type, are more particularly advantageous as regards the invention. In practice, the invention is intended more for superconducting-type machines for which the current orienting field is around 1.5 to 3 tesla in standard clinical use, around 4 to 4.5 tesla for medical experiments, more than 9 tesla for state-of-the-art machines (at Chicago in the United States of America for example) and up to 11.74 tesla in the most recent projects. Reminders relating to nuclear magnetic resonance imaging are available in European patent document EP-A-0 221 810. That patent document also indicates how to design gradient coils that are as linear as possible for a given size. PCT patent document published under the number WO-A-89/03031 also shows how, for gradient coils, especially those presented in the above patent document, it is possible to obviate eddy current problems.

As indicated in both these documents, the temporary character of the gradient pulses requires a solution, in addition to the problem of linearity of the field that these gradient coils provide (commonly referred to as the homogeneity problem, which term will be used in the rest of the text), but to problems associated with the pulsed character. The more the increase in the intensity of the orienting field of an NMR machine leads firstly to images of better quality being acquired, the more this increases the frequency of the detectable NMR signal. For the stronger-field machines indicated above, this frequency will reach up to 500 MHz. Always using gradient coils designed for lower-field machines results in a relative loss of sensitivity of the useful field gradient component (that component which is oriented parallel to the orienting field of the machine). This is because a gradient slope of the order of 10 millitesla per meter is sufficient for machines operating at 1 tesla. However, for machines operating at about 10 tesla, a slope of 100 to 150 milliteslas per meter is desired. It is therefore necessary to produce gradient coils (or gradients for short) that are capable of producing a larger variation in the component for differentiating the space.

Such higher gradients result in several types of problem. Firstly, the power dissipated by the gradient coils capable of such slopes becomes very high—of the order of a few tens of kW. It is therefore necessary to install an effective cooling system so that these gradient coils do not heat up the patient and the cryostat in which the main superconducting magnetization coil is contained.

Furthermore, in imaging sequences currently used, rapid sequences include the application of gradient pulses whose duration is of the order of a few milliseconds and the rise and fall times of which must be of the order of 1 millisecond.

With the electrical power levels involved, the gradient coils are therefore subjected, in the orienting field of the machine, to very sudden accelerations due to the electromagnetic forces. These accelerations cause, on the one hand, deterioration of the machine in the short term and, on the other hand, the production of noise level that the patient under examination cannot bear. The noise constraint is also a particularly problematic constraint when, in particular in the context of examining the brain, it is desired to demonstrate which areas of the brain are stressed during a particular intellectual exercise. It is therefore difficult to request a patient to carry out a particular intellectual exercise (for example to perform mental addition or multiplication operations) while subjecting him to noise of such a level that his concentration is impeded.

Although this type of experiment would be conceivable with a human being, preclinical experiments carried out on animals are therefore impossible if these animals are also exposed to these noise levels.

All of these problems must of course be solved while taking into account the fact that the size of the gradient coils is limited, in order to leave a sufficiently large useful volume for examination. By way of indication, it should be noted that, because this is now standard practice in the field, the useful examination volume is a tunnel of circular cross section, the diameter of which must be about 550 millimeters, the gradient coils having to be held in an annular space lying between this useful tunnel volume and the volume inside the walls of the cryostat. This volume internal to the cryostat provides a circular tunnel about 1000 millimeters in diameter.

Moreover, the pulsed character of the gradient pulses causes parasitic phenomena owing to the appearance of eddy currents which, on the one hand, heat up the machine and, on the other hand, destroy the linearity of the gradient during their existence. It is known, in particular from the abovementioned documents, to devise compensation coils that are also to be housed in the annular space available for avoiding this problem.

The possibility of producing gradient coils in which the current return is effected over a circumference of a circle larger in diameter than that in which the current useful for creating the gradient flows is known from the thesis "*Quiet magnetic resonance imaging gradients*" by An Da Yeo in October 2000, University of Queensland in Australia, page 31 et seq. However, the solution presented has the drawback that it is possible to produce only two angular sectors not exceeding π/2 for accommodating the orientation gradients. This is because, as it is necessary to position both X gradient coils and Y gradient coils, the presence of these coils on one and the same general mandrel results in the space available for each of these two sets of coils being restricted to two cylindrical sectors with an opening of π/2 each time. This limitation in opening precludes, in practice, the desired linearity of the gradients being obtained.

The aim of the invention has been to solve all of these problems, especially a manufacturing problem since the solution presented by the above thesis cannot be exploited on an industrial scale. In the invention, in order to generate the gradients, the available annular space is devoted to the installation of tubes in which circular solenoid coils are fitted. Preferably, the tubes are contiguous with one another and form a sheet of tubes. It would however be conceivable, at least in theory, to have several sheets of tubes of smaller diameter therein. Each sheet would be placed concentrically in this annular space.

It will be shown below how the arrangement of the coils in the tubes makes it possible to achieve the expected result of a high intensity of the gradients generated thanks to the possibilities of improved cooling, compliance with the linearity constraints imposed by the specifications, reduced acoustic noise and limited eddy currents.

The disappearance of the noise derives from the solenoidal structure of the coils fitted in tubes having axes parallel to the main field and from their being stressed only radially with respect to their own structure, the torque resulting from the electromagnetic stresses being zero.

It will also be shown that the structures thus recommended, especially in respect of the X and Y gradients, having a field orientation perpendicular to the conventional gradient coils, produce, in the shields or the various metal walls of the cryostat, appreciably lower eddy currents, for which it is even no longer necessary to compensate.

One of the principles of the invention is therefore to produce circular coils instead of producing trapezoidal coils, such as those suggested by the abovementioned thesis. Another basic idea of the invention is to reduce the opening of the circular cylindrical sector. Instead of using $\pi/2$, a smaller fraction of a cylindrical sector is used so as to place other tubes, and therefore other coils, in the space thus freed. It will be shown that these other coils, supplied as the invention specifies, contribute to the achievement of better linearity of the field gradient produced.

The subject of the invention is therefore an NMR machine of the circular cylindrical type comprising a cylindrical annular space for accommodating devices for generating a magnetic field gradient, characterized in that these generating devices comprise circular solenoidal coils, whose diameter is inscribed within a thickness of the annular space and whose axis is parallel to the main field.

The invention will be more clearly understood on reading the description that follows and from examining the figures that accompany it. These are presented merely by way of indication and imply no limitation of the invention. The figures show.

Figure 1:
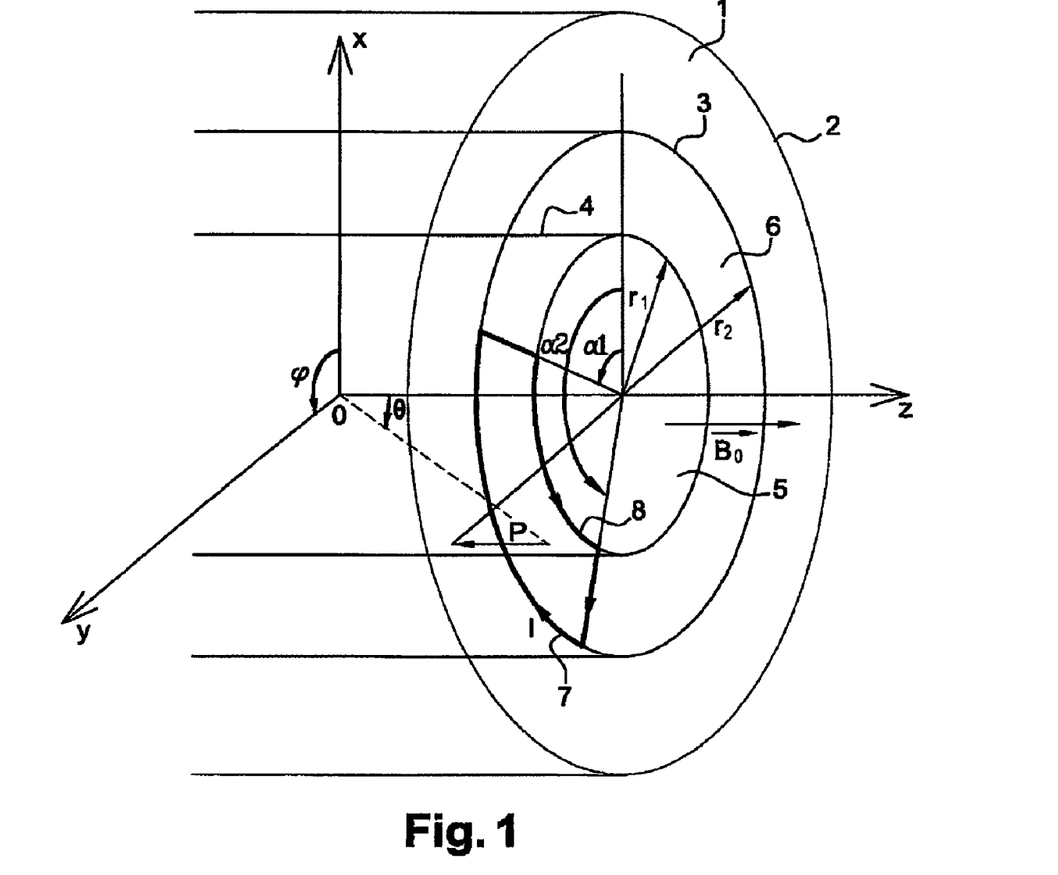
FIG. 1: a schematic representation of the tunnel of an NMR machine having an annular space available for accommodating the devices of the invention.

FIG. 1 shows very schematically an NMR machine according to the invention. This machine comprises, in the superconducting domain, a cryostat chamber 1 of the circular cylindrical and annular tunnel type, bounded by an external metal wall 2 and an internal metal wall 3. In practice, the walls 2 and 3 could be made of a nonconducting material, especially an epoxy resin. However, for mechanical strength and sealing reasons, it turns out that the walls are always made of metal and therefore result in deleterious eddy currents being generated. Placed inside the volume circumscribed by this cryostat is a shield 4 that defines a useful circular cylindrical internal region 5 of radius r1. The coil contained in the cryostat produces an intense uniform field $B_0$ approximately parallel to the axis of the tunnel.

The machine of the invention therefore includes a circular cylindrical annular space 6, between the region 5 and the wall 3, intended to accommodate the magnetic field gradient generating devices. In practice, the devices incorporated in the annular space 6 generate magnetic fields oriented in various directions in space. The components of these magnetic fields that are not oriented like the orienting field $B_0$ contribute to only the second order (and therefore negligibly in the case of the values of $B_0$ and of the gradients in question) to the modification of the useful NMR signal. Thus, the only component of these magnetic fields, generated by the gradient coils, which is advantageous and useful is the component oriented along the field $B_0$. This useful component is conventionally called the $B_z$ component. The machine is referenced with respect to a Cartesian reference frame, the z axis being collinear with the direction of the uniform field $B_0$ and parallel to the generatrices of the tunnel machine. Depending on the various sets of gradient coils supplied, the useful component $B_z$ at one point will see its amplitude increase as a function of the abscissa x of a plane containing this point, parallel to the yOz plane in respect of the X gradients, depending on the ordinate Y of a plane containing this point, parallel to the xOz plane in respect of the Y gradients, or as a function of the dimension z of a plane containing this point, parallel to the xOy plane in respect of the Z gradients.

FIG. 1 shows in particular the solution recommended by the abovementioned thesis, in which useful current returns 7 and 8 result in the production of coils of substantially trapezoidal cross section, with an angular opening of $\pi/2$, these being unsuitable for industrial production and for good mechanical resistance to vibrations.

Figure 2:
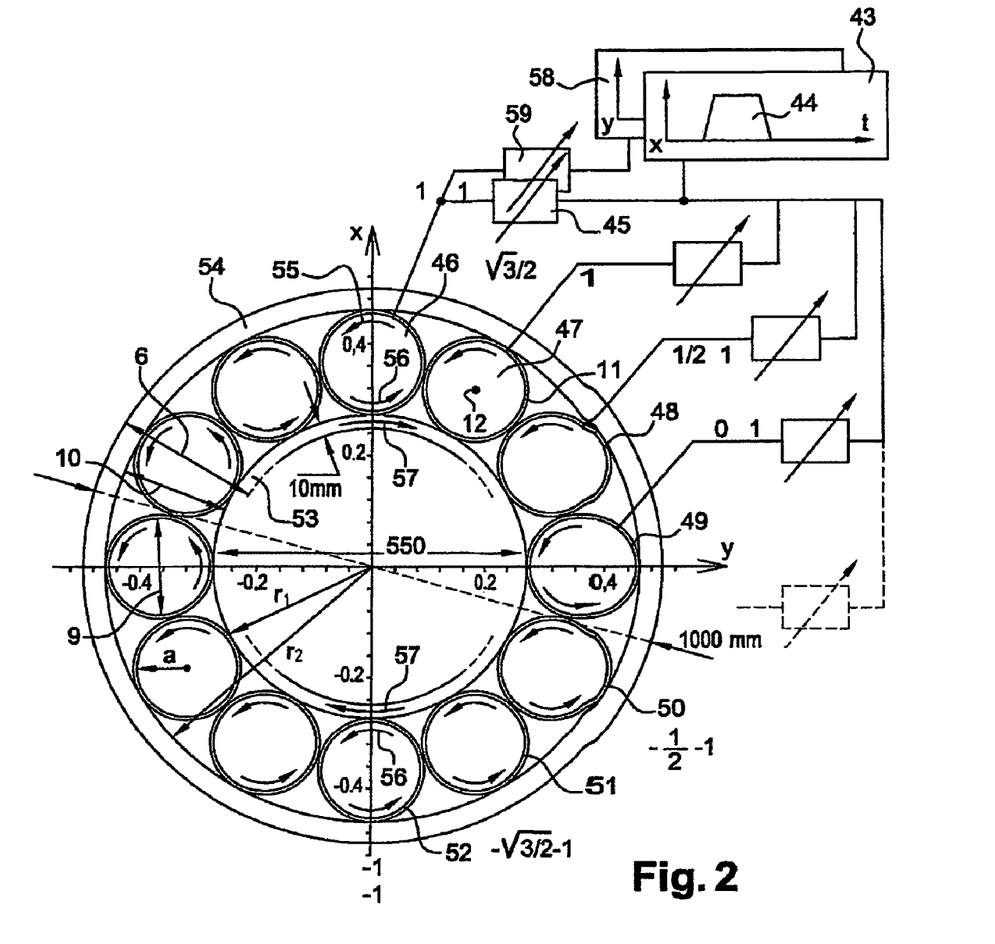
FIG. 2: a modification of the machine of FIG. 1 according to the invention in a sectional plane perpendicular to the main field, that is to say perpendicular to the axis of the tunnel.

In the invention, FIG. 2 shows the cylindrical annular space 6 as containing circular solenoidal coils whose diameter 9, with a value $2a$, is inscribed within a thickness 10 of this annular space 6. It may first be accepted that the thickness 10 of the annular space is equal to the total thickness of this space 6. Additional annular devices present on the inner and outer periphery of the space 6 are the result of desired improvements, but these are not essential. In the example shown, the annular space 6 is thus occupied by twelve tubes formed by walls 11 made of plastic or of another electrically insulating material. Fitted inside the tubes 11 are coils for generating magnetic gradient fields. These will be described later. Preferably, the tubes are contiguous with one another. Here they are distributed as a single sheet, the diameter of each of the tubes occupying substantially the thickness 10 of the space 6. However, it would be conceivable to propose several sheets with tubes of smaller diameter.

In the example shown, there is preferably an even number, i.e. 2n, tubes for forming the X or Y gradients. However, to form the Z gradients, there need not be an even number of tubes.

In a preferred embodiment that will be seen later, each tube is provided with a set of coils that is exactly identical to a set of another tube. This set of coils is capable of producing a Z gradient and a gradient in a direction chosen to be perpendicular to the Z axis. It will be shown later how the various coils are designed for producing the X or Y orientation gradients by controlling the various coils.

A few basic notions useful for understanding the invention are presented below. Inside a magnetically empty sphere of center O and of radius $r_{max}$, each component $B_x$, $B_y$ and $B_z$ has its zero Laplacian. Thus, $\Delta B_z=0$ and $B_z$ is expressed by a single expansion in terms of spherical harmonics of the form:

$B_z(r, \theta, \phi)/B_0 = 1 + \Sigma^{\infty}{n=1}(r/r_0)^n[H_n P_n(\cos\theta) + \Sigma^n m=1 (I^m_n \cos m\phi + J^m_n \sin m\phi) W^m_n P^m_n(\cos\theta)];$ $B_z$ is completely described by $B_0$, the field with the origin O, and the coefficients $H_n$, $I^m_n$ and $J^m_n$;

$r_0$ is a reference length, for example the radius of the sphere in question; and $W^m_n$ is a numerical weighting factor introduced for convenience, such that $|W^m_n P^m_n(\cos(\theta))| \leq 1$, such as $|P_n\{\cos(\theta)\}|$. Under these conditions, the coefficients $H_n$, $I^m_n$ and $J^m_n$ provide their maximum contribution directly to the inhomogeneity of $B_z$ on the sphere of radius $r_0$.

If the field sources possess symmetry properties, certain terms $H_n$, $I^m_n$ and/or $J^m_n$ will be zero. For a system of source currents axisymmetric about Oz, especially for z-type gradients, the expansion of $B_z$ inside a magnetically empty sphere reduces to $B_z(r,\theta,\phi)/B_0 = 1 + \Sigma_{n=1}^{\infty}(r/r_0)^n H_n P_n(\cos\theta)$.

In addition, if the source system is symmetric or antisymmetric with respect to the xOy plane, the odd-order terms or even-order terms will be zero, respectively. To produce a gradient $\delta B_z/\delta z$, the antisymmetry will be used and the expansion will then be written as $B_z(r,\theta,\phi)/B_0 = \Sigma_{p=0}^{\infty}(r/r_0)^{2p+1} H_{2p+1} P_{2p+1}(\cos\theta)$.

Since such a system produces a zero field at the origin, $B_0$ is simply a reference field. The component $H_1$ gives the value of the gradient, since the first term is expressed as $H_1 z/r_0$ and the higher-order terms $H_{2p+1}$ will generate imperfections. As specified by the invention, by choosing the number and the dimensions of the coils, the linearity of the gradient will be improved, firstly by eliminating $H_3$, then $H_5$, etc., until the specifications are reached.

In the case of source current systems generating gradients $\delta B_z/\delta x$ and $\delta B_z/\delta y$ is somewhat trickier. It will firstly be recalled that we are interested only in the component $B_z$ of the field for the reasons expressed above. For example, to generate a gradient $\delta B_z/\delta x$, the system of source currents must be symmetrical with respect to the xOy and yOz planes. The expansion of $B_z$ therefore now contains only terms in $I^{2q+1}_{2p+1}$ $B_z(r,\theta,\phi)/B_0 = \Sigma_{p=0}^{\infty}(r/r_0)^{2p+1}\Sigma^p_{q=0} I^{2q+1}_{2p+1} W^{2q+1}_{2p+1} P^{2q+1}_{2p+1}(\cos\theta) \cos(2q+1)\phi$.

Since such a system produces a zero field at the origin, $B_0$ is simply a reference field. The component $I^1_1$ gives the gradient, as the first term is expressed as $I^1_1 x/r_0$ and the higher-order terms $I^{2q+1}_{2p+1}$ will generate imperfections.

This being so, the idea of the invention is to close the circuits other than in the way described with reference to FIG. 1, which would result in the substantially trapezoidal coil sections. In particular the idea was to produce coils of circular form for the reasons explained above. Then, in addition, the idea firstly was to eliminate the terms of order $m \geq 3$ by simultaneously supplying several coils with currents of judiciously chosen intensities. Secondly, the idea was to use coils for the X gradient and coils for the Y gradient, it being possible for certain coils to be used simultaneously for both types of gradient.

In practice, to produce such a gradient system according to the principle of a set of identical tubes of axes parallel to the Oz and equidistant from Oz, it is necessary to be able to have an even number of tubes, preferably of possible larger diameter inside the annular space 6 circumscribed by the main magnet (with a diameter of about 1000 mm).

Moreover, the largest cylinder that can be inscribed inside the sheet or sheets of tubes must allow passage for the patient and for the antenna (i.e. a free space with a diameter of about 550 mm).

It has been found that the solution with n=12 tubes is preferably adopted, with the following relationships between the radius a of the tubes and the radii $r_1$ and $r_2$ of the cylinders tangential to the inside and to the outside of the tubes respectively, and which define the annular space 6. This is because, for n=12, the following formula for strictly contiguous tubes: $a = r_1(\sin\pi/n)/(1-\sin\pi/n) = r_2(\sin\pi/n)/(1+\sin\pi/n)$ gives:

a=0.349198$r_1$=0.205605$r_2$
$r_1$=2.863703a
$r_2$=4.863703a
$r_2/r_1$=1.698396
$r_1/r_2$=0.588791.

Therefore, in one example for strictly contiguous tubes:
$r_1$=275 mm; a=96 mm; $r_2$=467 mm, or
$r_2$=450 mm; a=92.5 mm; $r_1$=265 mm, or
$r_1$=275 mm $r_2$=450 mm; a=87.5 mm, depending on the dimensions chosen to be set. Of course, it is not necessary for the tubes to touch one another but, for greater effectiveness, it is desirable to use the maximum amount of space available in the machine in question.

There now remains only to find the number of coils per tube, their dimensions and the current density (value and waveform) in order to obtain the desired linearity, by dissipating the minimum amount of power (it is also possible to seek to limit the self inductance in order to meet scanning speed specifications). The constraints and choices made in the invention are to house the X (or Y) gradient coils and the Z gradient coils in the same tube, all the tubes being identical in order to facilitate industrial production. For a Z gradient, all the Z coils of the tubes are also chosen to be pulsed with the same current, +I or −I, depending on whether they are on one side of the xOy plane or the other. For an X gradient, the two X tubes whose axes lie in the xOz plane are pulsed with the current +I in the case of one of them and with −I in the case of the other, the first four tubes adjacent these two tubes are pulsed with $+I\sqrt{3}/2$ or $-I\sqrt{3}/2$ and the four second adjacent tubes with +I/2 or −I/2, i.e. 10 tubes generating in total 3 times the gradient of the first two, thus ensuring that all the inhomogeneity terms of order $m \geq 3$ are eliminated, the first non-zero terms appearing at the order m=11. For a Y gradient, the procedure is similar: it suffices to replace "the xOz plane" with "the yOz plane" in the above sentence. If it is desired to generate simultaneously a X gradient and a Y gradient, some of the coils will have to be supplied with the algebraic sum of the currents corresponding to the two gradients.

All the coils transporting the same current may be supplied by the same amplifier, by suitably connecting them (while respecting the + and −) in series, but other combinations may be chosen in order to have less powerful amplifiers. For example, it is possible to pulse, per tube or per half-tube, the Z coils on the one hand and the XY coils on the other, thereby resulting in 24 or 48 amplifiers respectively.

Figure 3:
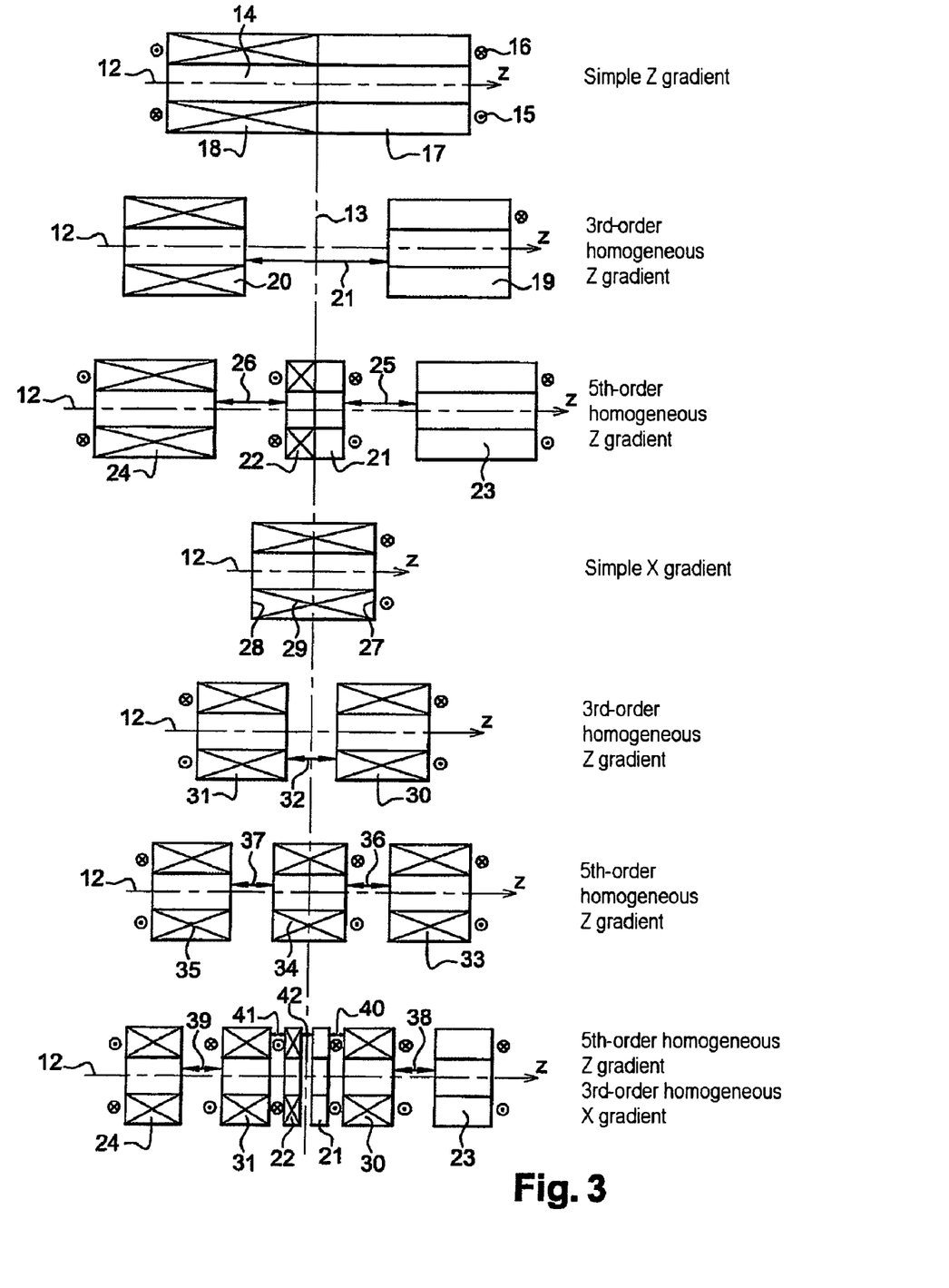
FIG. 3: schematic representations of gradient coils produced in each of the tubes of FIG. 2 in order to generate Z gradients, to generate X (or Y) gradients or to generate XZ (or YZ) mixed or hybrid gradients.

FIG. 3 shows how to produce gradient coils to be fitted into the tubes, such as 11. FIG. 3 shows circular solenoidal coils whose axes 12 of revolution are based at the center of the tubes 11 and are parallel to the Z axis. Indicated in FIG. 3 is the line 13 of the central xOy plane of the machine. The coils depicted in FIG. 3 show that the internal space 14 of the coils may be free. It will be seen later how this space may be occupied, and/or may also be used for cooling the coils. The coils include, depending on the direction of the current flowing therein, symbols 15 indicating the tip of an arrow or symbols 16 indicating the feathers of an arrow, showing the direction of rotation of the current in the coil.

To manufacture a simple Z gradient, all that is required, in each tube, is to have two coil elements 17 and 18, symmetrical with respect to the plane 13, and in which the current flows in a respectively counterrotating manner. The set of these elements 17 and 18 produces a simple Z gradient, that is to say a homogeneous gradient of order 1 ($H_3$, $H_5$, etc. are nonzero). The regular distribution of all the tubes around the Oz axis ensures that the only nonzero terms $I_n^m$ or $J_n^m$ are such that n+m is odd, m being an integer multiple of the number of tubes and always $\leq n$, thereby rendering them, in the case of 12 tubes, completely negligible. However, inhomogeneity terms in $H_n$ remain. It is possible to obtain a third-order homogeneous Z gradient ($H_3$=0) if the two contiguous elements 17 and 18 are replaced with two elements 19 and 20 separated from each other by a longitudinal space 21 in the tube. Likewise, to obtain a fifth-order homogeneous Z gradient ($H_3$=$H_5$=0), a set of two elements 19 and 20 is replaced with a set of four elements 21 and 22, and 23 and 24. The two elements 21 and 22 are contiguous and counterrotating. The two elements 23 and 24, which are also counterrotating, are separated from each other by a greater distance than the elements 19 and 20. The inhomogeneities then result from the remaining terms $H_7$, $H_9$, etc. and in practice it is largely sufficient not to complicate the structure in order to further improve the homogeneity. However, this would be possible, according to the same principle, by increasing the number of coils for example. The table below summarizes the principle of obtaining homogeneity of the Z gradients according to the invention and corresponds to the case of only three uniformly distributed tubes (in the practical case with 12 tubes, the nonzero terms $I_n^m$ or $J_n^m$ would appear only beyond m=12, as indicated above):

[Table of H, I, J terms with crosses indicating zero values — triangular arrangement from $H_0$ through $H_9$ with corresponding $I_n^m$ and $J_n^m$ entries]

The term s scored out by a cross x are 0 because of the antisymmetry relative to the xOy plane, those crossed out by a \ are 0 because of the uniform distribution of the identically supplied three tubes, and those scored out by / are 0 because of the arrangement of the coils in each tube (fifth-order homogeneity in this example).

As regards the single X gradient, this may be obtained by a single coil element 27 centered in the mid-plane 13. In this case, a homogeneous first-order X gradient is obtained. It should be noted that for the X gradient, a current flows through a pseudocoil element 28 on the left relative to the plane 13 in the same direction as through a pseudocoil element 29 to the right of the plane 13, together forming the coil element 27. To obtain a third-order homogeneous X gradient, it is necessary, in the tubes, to install, instead of the coil element 27, two coil elements 30 and 31 separated from each other by a space 32. The currents in the elements 30 and 31 circulate in the same direction. Likewise, to obtain a fifth-order homogeneous X gradient, it is necessary to replace the elements 30 and 31 with a triplet of elements 33, 34, 35 separated from one another by identical spaces 36 and 37 respectively. The table below summarizes the principle for obtaining the homogeneity of the Z gradients according to the invention for a set of 12 tubes:

[Table of H, I, J terms with crosses indicating zero values — triangular arrangement from $H_0$ through $H_9$ with corresponding $I_n^m$ and $J_n^m$ entries]

The terms scored out by a cross x are 0 because of the symmetry relative to the xOy and yOz planes, those scored out by a \ are 0 because of the distribution of the currents in the 10 tubes supplied as indicated above (2 with ±I, 4 with ±$I\sqrt{3/2}$ and 4 with ±I/2) and those scored out by a / are zero because of the arrangement of the coils in each tube (third-order homogeneity in this example).

In a final representation of the invention depicted at the bottom of page 3, a hybrid gradient is formed, namely fifth-order homogeneous Z gradient and a third-order homogeneous X gradient, by combining the fifth-order homogeneous Z gradient with the third-order homogeneous X gradient. In practice, the gaps 25 and 26 are modified so as to introduce the coils 30 and 31 thereinto. The space 32 itself is enlarged so as to accommodate the coils 21 and 22 therein. For practical reasons, the coils 21 and 22 are themselves separated from each other by a set space, allowing the current returns and the installation of mechanical installation elements. Finally, the gaps 38 and 39 between the coils 30 and 23 on the one hand, and 31 and 24 on the other, and the gaps 40 and 41 between the coils 21 and 30 on the one hand, and 22 and 31 on the other, now remain. The central space 42 in one example is limited to 20 mm.

By acting in this way, it is possible to obtain a fifth-order homogeneous Z gradient and a third-order homogeneous X gradient. It should be noted that this arrangement advantages the homogeneity of the Z gradient relative to the homogeneities of the X (or Y) gradients. This may be tolerated insofar as the Z gradient must benefit, for various reasons, from better homogeneity.

If, however, the homogeneity of the X gradient is insufficient, it is possible, according to the invention, to increase it and especially to eliminate the fifth-order inhomogeneities by using three coils 33, 34 and 35 in each tube. There is then no longer sufficient space in the same tube for the coils that generate the Z gradient, but this may be achieved by conventional coils as will be explained later.

To supply the coils 30 and 31, or 33, 34 and 35, depending on the homogeneity produced, FIG. 2 shows that, for an X gradient, an electronic circuit 43 produces a temporal pulse 44 having the waveform (rise time, fall time) and the duration required by an imaging sequence to be carried out with the NMR machine. The signal 44 representative of the pulse is introduced into a variable-gain-controlled amplifier 45.

The control signal applied to the amplifier 45, produced by a computing system that manages the sequences, applies a nominal current multiplied by a coefficient, which here is equal to 1 for the coils located in a tube 46 lying in the xOz plane.

A tube 47 contiguous with the tube 46, the axis of which tube 47, here 12, lies in a plane passing through the Z axis and is inclined by $\pi/6$ to the xOz plane, is supplied by a current multiplied by a coefficient equal to $\sqrt{3/2}$. For a tube 48 contiguous with the tube 47 and again offset from the latter by $\pi/6$, the current is multiplied by $\frac{1}{2}$. For a tube 49 contiguous with the tube 48 and lying in a yOz plane, the coefficient is equal to 0. For a tube 50 symmetrical with the tube 48, the coefficient is equal to $-\frac{1}{2}$, for a tube 51 symmetrical with the tube 47 it is equal to $-\sqrt{3/2}$ and for a tube 52 symmetrical with the tube 46 relative to the Z axis, the coefficient is equal to $-1$. For the tubes located on the left of the figure and symmetrical with the tubes 46 to 52 relative to the xOz plane, the coefficient values are the same (being negative below the Y axis and positive above the Y axis).

Figure 5A:
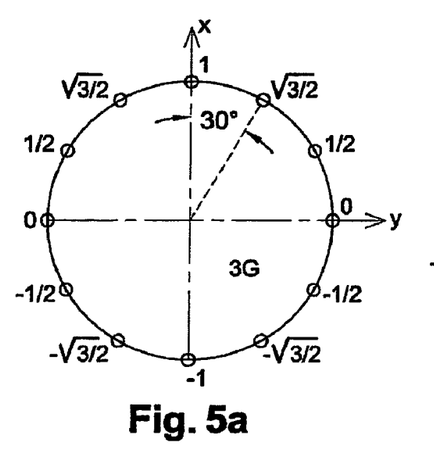
FIGS. 5a and 5b: current supply values for the various coils, depending on their position in the machine, and for a given orientation of the gradient to be employed.
Figure 5B:
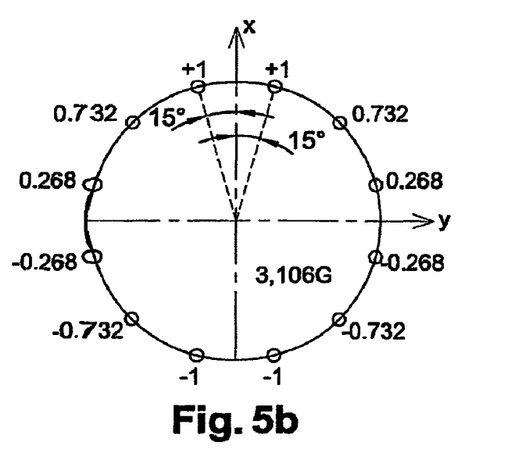

Thus, the current in a coil is proportional to the cosine of the angle, around the perimeter of the circular space, for locating the tube that contains said coil. This current distribution is repeated in FIG. 5a, but it is possible to use an alternative version in which the offset is 15°, as shown in FIG. 5b.

For a Z gradient, the Z coils, that is to say the coils 21, 22 and 23 and 24 of each of the tubes 46 to 52 (and the symmetrical ones on the left-hand part of the X axis in FIG. 2), are actuated with a nominal current.

As a variant, if the X gradient has to be homogeneous to more than the third order, provision may be made to fill the tubes 46 to 52, and those symmetrical thereto, with coils intended only to produce the X (or Y) gradient. In this case, for producing the gradient coils generating the Z gradient, two spaces are reserved, these being located on either side of the space 6 in the useful thickness 10. In FIG. 2, these are the spaces 53 and 54. In this case, these spaces are used to install therein Z gradient coils of known annular type, as described in the aforementioned documents.

In the case in which it is possible to install hybrid coils in the tube, it may be necessary to eliminate the effects of eddy currents produced by the Z gradients, which are higher than those in the case of X gradients. In this case, the compensating Z gradient coil is placed in the space 53 (or in the space 54 or possibly in both). This coil is of the type described in the aforementioned second patent document. FIG. 2 therefore shows one particularly beneficial effect of the structure of the invention if the compensating coil is placed in the space 53. This is because, in the case of the Z gradient, the currents, indicated by arrows such as 55 and 56, flowing in the coils located in the tubes are all in a given sense (for a given position relative to the plane 13 of the machine). This direction 55 or 56, depending on the diametrically opposed side of the coil in question, is of the same sense or of the opposite sense to the direction 57 of the current flowing in a conventional compensating Z gradient coil. One particularly beneficial effect is therefore observed in that the directions 56 and 57 are in the same sense (or else they would be the directions 55 and 57 owing to the various distributions of the currents in the various coils). It follows that the compensating field helps to increase the field gradient, while still eliminating the eddy currents in the walls 2 and 3 of the cryostat 1. In fact, with the structure thus recommended, the same compensated gradient is obtained but with electrical power dissipated in the gradient coils and in the compensating coils.

With regard to the coils for compensating for the eddy current effects due to the X (or Y) gradient coils, it may be shown that, because of the configuration of the field produced, the eddy currents are weaker than in the case of the gradients in the structure described in the cited documents and that it is possible to dispense with compensating for them.

Up until now, the coils presented are used for creating the X gradient. Of course, by rotating the assembly through 90° it is possible for the same coils to be used for creating the Y field gradients. In practice, the symmetry about the xOz and yOz planes means that a number of tubes adopted is a multiple of 4, but this is not absolutely necessary—it will be seen later why 12 tubes is a preferred solution.

If the gradient pulses 44 along an X axis are simultaneous with gradient pulses along another, Y axis, the amplifiers for certain tubes will have to be controlled by an appropriate composite order produced by the sequencer that establishes the imaging sequences.

However, it should be noted that, by acting in this way, a remarkable result is obtained, whereby, on the one hand, all the tubes 46 to 52 and those that are symmetrical thereto on the other side of the xOz plane are provided with the same set of coils, that shown at the bottom of FIG. 3, and whereby, on the other hand, each group of coils is controlled by an amplifier. One amplifier is used to supply the Z gradient coils 21, 22, 23 and 24 (taking care to reverse the direction of the current depending on whether the coils are located along the field $B_0$ toward the upstream end or the downstream end) and another amplifier is used to supply the elements 30 and 31 forming the X or Y gradient. The amplitudes of the currents in these coils depend on the positional location in the space 10 of the tube 11 that contains them. For twelve tubes, 24 amplifiers are therefore installed. A greater number of amplifiers of less power may be provided, as explained above.

Figure 4:
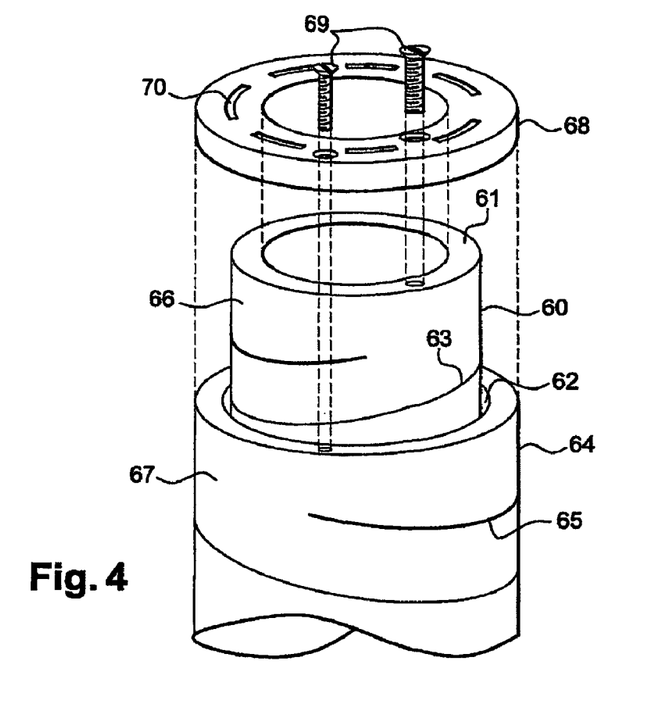
FIG. 4: a representation of one particular embodiment of the elements of a gradient coil installed in one of the tubes.

FIG. 4 shows an illustrative example of a coil element such as 17 to 18, 21 to 24, 27, 30 to 31, or 33 to 35. Such a coil consists of a set of helical turns formed from tubular sleeves. For example, a sleeve 60, made of pure copper because there is no need to withstand high mechanical stresses, thus benefits from a high conductivity. In one example, the thickness 61 of such a sleeve is 10 mm. A sleeve 60 is placed in an electrical discharge machining machine that cuts, right through the thickness of the wall of this tube 60, a helical groove 63. The groove emerges on each side of the wall. In one example, the groove has a width of one tenth of an mm. Ones with a rectangular profile may thus be easily produced. To prevent the structure thus produced from being weakened, the helical grooves 63 are filled with an impermeable adhesive filled with glass beads, so as to maintain the spacings between the turns despite the low hardness of the adhesive.

The sleeve 60 may be nested in another sleeve 64, prepared in exactly the same way, but with a helical groove 65 with the reverse pitch, leaving an annular space 62 for passage of a cooling fluid. In one example, the width of this space is 1 mm. In practice, the grooves 63 and 65 are not produced right to the end of the sleeves 60 or 64 so that the terminal rings, such as 66 and 67, remain at the ends of each of them. The current flowing in the turns of the coil 60 is selected by the terminal ring 66, which is itself connected to a ring 68 connected to the terminal ring 67 of the sleeve 64 to which the sleeve 60 is tightly slipped. The current at the other end of the turns of the sleeve 64 is selected in the same way and is injected into the terminal ring of the next sleeve, and so on. The sleeves 60, 64 et seq. are thus nested in one another in the manner of a matrioshka (Russian doll). From one sleeve to another, the currents are conducted via a ring, such as 68, which connects together two adjacent terminal rings. The rings 68 serve on the one hand to provide electrical continuity and on the other hand mechanical retention of the sleeves forming the desired coil element, for example by means of bolts 69. Thus, an even number (for example 4) of sleeves may be stacked one in another so that the terminal connections are on the same side, or an odd number (for example 5) of sleeves may be stacked so that the terminal connections are on each side of the coil. It will be noted that the contribution to the field gradient produced by the coil element is greater the larger the diameter of a sleeve.

The rings, such as 68, are also pierced by slots in the form of circular segments, such as 70. The slots 70 are used for the flow of an insulating cooling fluid, for example a heat-transfer oil. This insulating fluid on entering the tube 11 flows in parallel through the annular space lying between the sleeves 60 and 64, or 64 and the next sleeve, and so on. At the other end, the cooling fluid expands in the tube 11 which comprises the element thus cooled and will, downstream, cool another element located in the same tube. It may be shown that, by acting in this way, it is possible both to produce a high gradient power and to have great cooling capability.

To adjust the homogeneity and the intensity of the gradients, not only the dimensions of the coils but the number and distribution of the turns 63 and 65, which each of the sleeves of each of the elements of these coils contain, may be varied. Thus, it is possible to provide a larger or smaller number of sleeves and for the helices 63 or 65 to have a more steeply or less steeply inclined pitch.

FIGS. 5a and 5b show by way of comparison the distribution of the tubes according to what was described above (FIG. 5a) and another distribution of these tubes in which the entire assembly is shifted by 15°. In the case of FIG. 5b, to obtain an X gradient, it is necessary to apply to the multiplicative coefficient for the amplifiers of the tubes closest to the xOz plane +1 or −1 coefficients depending on whether the abscissa of the tube is positive or negative. The four tubes adjacent to these first four tubes are assigned with the multiplicative coefficient 0.732 and with the corresponding sign, depending on whether their abscissa is positive or negative. The four tubes located symmetrically closest to the yOz plane are assigned the 0.268 or −0.268 coefficient, depending on whether their abscissa is positive or negative. To obtain Y gradients, all that is required is to shift the whole assembly through 90°.

By acting with the structure shown in FIG. 5b, in which the twelve tubes contribute to the generation of the gradient (and not only ten tubes as in FIG. 5a), the gradient produced is 3.106 times the gradient generated by the summit coils. The ratio of the electrical power involved to the amplitude of the gradient produced is however not modified—it is identical in both cases. The structure shown in FIG. 5b nevertheless makes it possible, for amplifiers capable of delivering a nominal current, to generate a gradient having a 3% higher maximum amplitude.

The justification for these results is as follows:

Within the context of calculating the distribution of the currents in the X or Y gradient tubes, an X gradient is chosen comprising 2n tubes equidistant from the Oz axis and uniformly distributed, that is to say angularly separated by $\pi/n$.

Moreover, there are two possible cases that have to be considered for satisfying the required symmetries:

case 1: the Ox axis cuts the axis of one of the tubes;

case 2: the Ox axis passes between two consecutive tubes, at the same distance therefrom.

It should be noted that, for a Y gradient, the situation is identical, but in relation to the Oy axis perpendicular to the Ox axis.

If n is even, i.e. the total number of tubes is a multiple of 4 (4, 8, 12 etc.), the situation is the same for the X gradient and for the Y gradient. However, if n is odd (total number of tubes being 2, 6, 10, 14, etc.), one case exists for the X gradient and another case for the Y gradient.

The main results obtained are presented here for an X gradient.

To eliminate the terms $I_{2p+1}^{2q+1}$ of order $2q+1=3$, it must be at least six tubes ($n \geq 3$).

In case 1, the two tubes that cut the Ox axis must be pulsed with a current ±I (+for the tube located on one side of the yOz plane and −for the other; NB: this ±convention is used throughout the rest of the description) and the four adjacent tubes, (two on each side of each of the previous tubes) must be pulsed with $$\pm \left( -\frac{1}{2\cos\frac{3\pi}{n}} \right) I,$$

for example ±I/2 for n=3 and ±I/$\sqrt{2}$ for n=4.

In case 2, for n=3, it is necessary to pulse the four tubes closest to the Ox axis with a current ±I. For n>3, it is necessary to pulse the four tubes closest to the Ox axis with a current ±I and the next four with $$\pm \left( -\frac{\cos\frac{3\pi}{2n}}{\cos\frac{9\pi}{2n}} \right) I.$$

It should be noted that other terms $I_{2p+1}^{2q+1}$ of order $2q+1$ higher than 3 are also eliminated, but not those of order 5.

One important feature of the invention is that, for $n \geq 5$, i.e. for more than 10 tubes, and therefore for the preferred number of 12, the terms $I_{2p+1}^{2q+1}$ may be made zero simultaneously for $2q+1=3$ and $2q+1=5$, which also entails elimination of higher orders $2q+1$ (in the case of 12 tubes, all the orders $2q+1 \leq 10$ are thus eliminated).

To do this, in case 1, it is necessary to pulse the two tubes across the Ox axis with a current ±I and the 4 adjacent tubes with $$\pm \left( \frac{\cos\frac{6\pi}{n} - \cos\frac{10\pi}{n}}{2\left(\cos\frac{3\pi}{n}\cos\frac{10\pi}{n} - \cos\frac{5\pi}{n}\cos\frac{6\pi}{n}\right)} \right) I$$

and the next 4 adjacent tubes with $$\pm \left( \frac{\cos\frac{5\pi}{n} - \cos\frac{3\pi}{n}}{2\left(\cos\frac{3\pi}{n}\cos\frac{10\pi}{n} - \cos\frac{5\pi}{n}\cos\frac{6\pi}{n}\right)} \right) I,$$

which gives, for n=6, i.e. 12 tubes, $\pm\sqrt{3}\ I/2$ and $\pm I/2$.

It should be noted that the numerical coincidence with the cosine of the angle that locates the tube occurs only for this case of 12 tubes, and is therefore not a general property.

In case 2, it is necessary to pulse the four tubes closest to the Ox axis with a current $\pm I$, the 4 adjacent tubes with $$\pm \left( \frac{\cos\frac{5\pi}{2n}\cos\frac{15\pi}{2n} - \cos\frac{3\pi}{2n}\cos\frac{25\pi}{2n}}{\cos\frac{9\pi}{2n}\cos\frac{25\pi}{2n} - \cos^2\frac{15\pi}{2n}} \right) I$$

and for n>5, the next 4 adjacent tubes with $$\pm \left( \frac{\cos\frac{3\pi}{2n}\cos\frac{15\pi}{2n} - \cos\frac{5\pi}{2n}\cos\frac{9\pi}{2n}}{\cos\frac{9\pi}{2n}\cos\frac{25\pi}{2n} - \cos^2\frac{15\pi}{2n}} \right) I,$$

i.e. for n=6 (12 tubes) $\pm 0.732051 I$ and $0.267949 I$, which may be rounded to the third decimal place.

The invention therefore makes it easily possible to obtain X gradient coils, for example those contained in the tubes 47 and 48, which contribute, because they are supplied with additional currents (because of the amplifier 59), to the generation of a Y gradient. Thus it may be stated that the coils of a first set of gradients includes coils of the second set of gradients. This is so in the case of FIG. 5a. In the case of FIG. 5b, the coils of the first set, which generate the first X gradient are the coils of the second set, which generate the second Y gradient. The coils of the first set include all the coils of the second set, and versa visa.

The invention claimed is:

1. An NMR machine of the circular cylindrical type comprising:
    a cylindrical annular space for accommodating devices for generating a magnetic field gradient, characterized in that these generating devices comprise circular solenoidal coils whose diameter is inscribed within a thickness of the annular space and whose axis is parallel to the direction of the main field,
    the solenoid coils generating a first field gradient (X) in a first radial direction of the machine and a second field gradient (Y) in a second radial direction of the machine, the first direction being perpendicular to the second direction; and
    a plurality of amplifiers for simultaneously supplying the solenoidal coils with an algebraic sum of currents corresponding to the first and second field gradients (X,Y).

2. The machine as claimed in claim 1, characterized in that a circular solenoidal coil, the diameter of which is inscribed within the cylindrical annular space and which generates a field gradient (Z) in a first direction (z), which is parallel to the direction of the main field, is coaxial with another solenoidal coil inscribed within the same tube in this cylindrical annular space and generating a field gradient (X) in a direction (x) perpendicular to the first direction.

3. The machine as claimed in claim 1, characterized in that the annular space includes, on an internal wall, annular coils for generating a magnetic field gradient oriented along the direction of the main field and, in the thickness lying between these two walls, solenoidal coils generating field gradients (X, Y) in directions perpendicular to the direction (z) of this main field.

4. The machine as claimed in claim 1, characterized in that the devices for generating a field gradient include, in the thickness of the annular space, first solenoidal coils generating a field gradient in a first direction (x), these first coils possessing among them a symmetry of construction relative to a first plane (xOz) that is radial to the machine and that contains this direction.

5. The machine as claimed in claim 1, characterized in that the circular solenoidal coils are distributed around the perimeter of the annular space in 2n arrangements of coaxial, solenoidal coils,.

6. The machine as claimed in claim 1, characterized in that the circular solenoidal coils are distributed around the perimeter of the annular space in 2n arrangements of coaxial solenoidal coils, several coils being supplied simultaneously by combinations of currents in order to generate an X gradient.

7. The machine as claimed in claim 6, characterized in that one component of a current flowing through a coil for generating a gradient is proportional to a nominal current multiplied by the cosine of the angle for locating the coil around the perimeter of the annular space.

8. The machine as claimed in claim 6, characterized in that one component of a current flowing through a coil for generating a gradient is proportional to a nominal current multiplied by a coefficient 1, 0.732 or 0.268, depending on the angle for locating the coil around the perimeter of the circular space, and in the case where n is equal to 6.

9. The machine as claimed in claim 1, characterized in that the annular space includes several contiguous tubes distributed around the perimeter in order to accommodate the circular solenoidal coils, the radius a of a tube being given by $ar_1(\sin\pi/N)/(1-\sin\pi/N)=r_2(\sin\pi/N)/(1+\sin\pi/N)$, in which formula N represents the number of tubes and $r_1$ and $r_2$ are the inner radius, and outer radius of the annular space, respectively.

10. The machine as claimed in claim 1, characterized in that the annular space includes several contiguous tubes distributed around the perimeter in order to accommodate the circular solenoidal coils, the structures and positions of the coils fitted into a tube being identical to structures and positions of coils fitted into other tubes, preferably in all the other tubes.

11. The machine as claimed in claim 1, characterized in that the annular space includes several tubes distributed around the perimeter in order to accommodate the solenoid coils, six coils being fitted into a tube, and the structures and positions of these six coils being symmetrical relative to a central plane of the tube perpendicular to the axis of this tube.

12. The machine as claimed in claim 1, characterized in that each circular solenoidal coil supplied by an individual power supply.

13. The machine as claimed in claim 1, characterized in that the circular solenoidal coils are formed from elongate helicoidal turns, along conducting circular sleeves, several sleeves of any one coil being concentric and nested one in another.

14. The machine as claimed in claim 13, characterized in that a cooling fluid flows through an annular space between two sleeves.

15. The machine as claimed in claim 1, characterized in that the field gradient generating devices comprise only devices for compensating for the effects of eddy currents due to the pulsed character of pulses for field gradients in the direction (z) of a generatrix of the machine.

16. The machine as claimed in claim 1, characterized in that the field gradient generating devices comprise only circular solenoidal coils for generating field gradients in directions (x, y) perpendicular to a generatrix (z) of the machine, the gradient coils for generating gradients in directions collinear with the generatrix of the machine being produced in the form of annular coils deployed on the outside of the annular space.

17. The machine as claimed in claim 1, characterized in that:
the annular space includes, on an external wall, annular coils for generating a magnetic field gradient oriented along the direction of the main field and, in the thickness lying between the external wall and an internal wall, solenoidal coils generating field gradients (X, Y) in directions perpendicular to the direction (z) of this main field.

18. The machine as claimed in claim 1, characterized in that:
the circular solenoidal coils are formed from elongate helicoidal turns of rectangular profile, along conducting circular sleeves, several sleeves of any one coil being concentric and nested one in another.

19. The machine as claimed in claim 1, characterized in that the devices for generating a field gradient include, in the thickness of the annular space, first solenoidal coils generating a field gradient in a first direction (x), these first coils possessing among them a symmetry of construction relative to a second radial plane (yOz) perpendicular to a first plane (xOz) that is radial to the machine and that contains this direction.

20. The machine as claimed in claim 1, characterized in that the circular solenoid coils are distributed around the perimeter of the annular space in 2n arrangements of coaxial, contiguous, solenoidal coils.

21. The machine as claimed in claim 20, characterized in that n is equal to 6.

22. The machine as claimed in claim 1, characterized in that the circular solenoid coils are distributed around the perimeter of the annular space in 2n arrangements of coaxial, solenoidal coils, several coils being supplied simultaneously by combinations of currents in order to generate a Y gradient.

23. The machine as claimed in claim 1, characterized in that the circular solenoid coils are distributed around the perimeter of the annular space in 2n arrangements of coaxial, solenoidal coils, several coils being supplied simultaneously by combinations of currents in order to generate a Z gradient.

* * * * *

UNITED STATES PATENT AND TRADEMARK OFFICE
CERTIFICATE OF CORRECTION

PATENT NO. : 7,403,009 B2
APPLICATION NO. : 10/571962
DATED : July 22, 2008
INVENTOR(S) : Guy Aubert It is certified that error appears in the above-identified patent and that said Letters Patent is hereby corrected as shown below:

Column 5, line 2, " $(I^n{}_m\text{cosm}$ " should read -- $(I^m{}_n\text{cosm}$ --;

Column 5, line 16, " $\Sigma_{n=1}^{\infty}$ " should read -- $\Sigma_{n=1}^{\infty}$ --;

Column 5, line 21, " $\Sigma_{p=0}^{\infty}$ " should read -- $\Sigma_{p=0}^{\infty}$ --;

Column 5, line 38, " $\Sigma_{p=0}^{\infty}$ " should read -- $\Sigma_{p=0}^{\infty}$ --;

Column 7, line 30, the table should be replaced as follows:

$$
\begin{array}{l}
\mathcal{H}_1 \\
H_1 \quad X_1^1 \\
\quad\; Y_1^1 \\
\mathcal{H}_2 \quad X_2^1 \quad X_2^2 \\
\quad\; Y_2^1 \quad Y_2^2 \\
H_3 \quad X_3^1 \quad Y_3^2 \quad X_3^3 \\
\quad\; Y_3^1 \quad X_3^2 \quad Y_3^3 \\
\mathcal{H}_4 \quad X_4^1 \quad X_4^2 \quad I_4^3 \quad X_4^4 \\
\quad\; Y_4^1 \quad Y_4^2 \quad J_4^3 \quad Y_4^4 \\
H_5 \quad X_5^1 \quad Y_5^2 \quad X_5^3 \quad Y_5^4 \quad X_5^5 \\
\quad\; Y_5^1 \quad X_5^2 \quad Y_5^3 \quad X_5^4 \quad Y_5^5 \\
\mathcal{H}_6 \quad X_6^1 \quad X_6^2 \quad I_6^3 \quad X_6^4 \quad Y_6^5 \quad X_6^6 \\
\quad\; Y_6^1 \quad Y_6^2 \quad J_6^3 \quad Y_6^4 \quad X_6^5 \quad Y_6^6 \\
H_7 \quad X_7^1 \quad Y_7^2 \quad X_7^3 \quad Y_7^4 \quad X_7^5 \quad I_7^6 \quad X_7^7 \\
\quad\; Y_7^1 \quad X_7^2 \quad Y_7^3 \quad X_7^4 \quad Y_7^5 \quad J_7^6 \quad Y_7^7 \\
\mathcal{H}_8 \quad X_8^1 \quad X_8^2 \quad I_8^3 \quad X_8^4 \quad Y_8^5 \quad X_8^6 \quad Y_8^7 \quad X_8^8 \\
\quad\; Y_8^1 \quad Y_8^2 \quad J_8^3 \quad Y_8^4 \quad X_8^5 \quad Y_8^6 \quad X_8^7 \quad Y_8^8 \\
H_9 \quad X_9^1 \quad Y_9^2 \quad X_9^3 \quad Y_9^4 \quad X_9^5 \quad I_9^6 \quad X_9^7 \quad Y_9^8 \quad X_9^9 \\
\quad\; Y_9^1 \quad X_9^2 \quad Y_9^3 \quad X_9^4 \quad Y_9^5 \quad J_9^6 \quad X_9^7 \quad X_9^8 \quad Y_9^9
\end{array}
$$

CERTIFICATE OF CORRECTION (continued)
U.S. Pat. No. 7,403,009 B2

Column 7, line 56, "term s" should read --terms--;

Column 8, line 16, the table should be replaced as follows:

$$
\begin{array}{l}
\mathcal{H}_{+} \\
\mathcal{H}_1 \quad I_1^1 \\
\phantom{\mathcal{H}_1} \quad X_1^1 \\
\mathcal{H}_2 \quad I_2^1 \quad X_2^2 \\
\phantom{\mathcal{H}_2} \quad X_2^1 \quad X_2^2 \\
\mathcal{H}_3 \quad I_3^1 \quad X_3^2 \quad X_3^3 \\
\phantom{\mathcal{H}_3} \quad X_3^1 \quad X_3^2 \quad X_3^3 \\
\mathcal{H}_4 \quad I_4^1 \quad X_4^2 \quad X_4^3 \quad X_4^4 \\
\phantom{\mathcal{H}_4} \quad X_4^1 \quad X_4^2 \quad X_4^3 \quad X_4^4 \\
\mathcal{H}_5 \quad I_5^1 \quad X_5^2 \quad X_5^3 \quad X_5^4 \quad X_5^5 \\
\phantom{\mathcal{H}_5} \quad X_5^1 \quad X_5^2 \quad X_5^3 \quad X_5^4 \quad X_5^5 \\
\mathcal{H}_6 \quad I_6^1 \quad X_6^2 \quad X_6^3 \quad X_6^4 \quad X_6^5 \quad X_6^6 \\
\phantom{\mathcal{H}_6} \quad X_6^1 \quad X_6^2 \quad X_6^3 \quad X_6^4 \quad X_6^5 \quad X_6^6 \\
\mathcal{H}_7 \quad I_7^1 \quad X_7^2 \quad X_7^3 \quad X_7^4 \quad X_7^5 \quad X_7^6 \quad X_7^7 \\
\phantom{\mathcal{H}_7} \quad X_7^1 \quad X_7^2 \quad X_7^3 \quad X_7^4 \quad X_7^5 \quad X_7^6 \quad X_7^7 \\
\mathcal{H}_8 \quad I_8^1 \quad X_8^2 \quad X_8^3 \quad X_8^4 \quad X_8^5 \quad X_8^6 \quad X_8^7 \quad X_8^8 \\
\phantom{\mathcal{H}_8} \quad X_8^1 \quad X_8^2 \quad X_8^3 \quad X_8^4 \quad X_8^5 \quad X_8^6 \quad X_8^7 \quad X_8^8 \\
\mathcal{H}_9 \quad I_9^1 \quad X_9^2 \quad X_9^3 \quad X_9^4 \quad X_9^5 \quad X_9^6 \quad X_9^7 \quad X_9^8 \quad X_9^9 \\
\phantom{\mathcal{H}_9} \quad X_9^1 \quad X_9^2 \quad X_9^3 \quad X_9^4 \quad X_9^5 \quad X_9^6 \quad X_9^7 \quad X_9^8 \quad X_9^9
\end{array}
$$

Column 12, line 24, "$I_{2p+1}^{2q+1}$" should read -- $I_{2p+1}^{2q+1}$ --;

Column 12, line 51, "$I_{2p+1}^{2q+1}$" should read -- $I_{2p+1}^{2q+1}$ --;

Column 12, line 55, "$I_{2p+1}^{2q+1}$" should read -- $I_{2p+1}^{2q+1}$ --; and Column 14, claim 5, line 29, "coils$_t$" should read --coils--.

Signed and Sealed this

Nineteenth Day of January, 2010

David J. Kappos
*Director of the United States Patent and Trademark Office*